(12) United States Patent
Yoon et al.

(10) Patent No.: US 6,908,892 B2
(45) Date of Patent: Jun. 21, 2005

(54) PHOTORESIST REMOVER COMPOSITION

(75) Inventors: Suk-Il Yoon, Kyungki-do (KR);
Young-Woong Park, Suwon (KR);
Chang-Il Oh, Seongnam (KR);
Sang-Dai Lee, Kyungki-do (KR);
Chong-Soon Yoo, Kyungki-do (KR)

(73) Assignee: Dongjin Semichem, Co., Ltd., Incheon (KR)

( * ) Notice: Subject to any disclaimer, the term of this patent is extended or adjusted under 35 U.S.C. 154(b) by 361 days.

(21) Appl. No.: 10/297,646

(22) PCT Filed: Jun. 7, 2001

(86) PCT No.: PCT/KR01/00966
§ 371 (c)(1),
(2), (4) Date: Dec. 9, 2002

(87) PCT Pub. No.: WO01/96964
PCT Pub. Date: Dec. 20, 2001

(65) Prior Publication Data
US 2003/0158058 A1 Aug. 21, 2003

(30) Foreign Application Priority Data
Jun. 12, 2000 (KR) .......................................... 2000-32225

(51) Int. Cl.$^7$ ............................... C11D 7/32; C11D 7/50
(52) U.S. Cl. ........................ 510/176; 510/175; 510/178; 510/212; 510/499; 510/500; 510/506; 134/2; 134/3; 134/38; 134/40
(58) Field of Search ................................ 510/175, 176, 510/212, 499, 500, 506; 134/2, 3, 38, 40

(56) References Cited

U.S. PATENT DOCUMENTS

| 4,617,251 A | 10/1986 | Sizensky |
| 4,770,713 A | 9/1988 | Ward |
| 5,308,745 A | 5/1994 | Schwartzkopf |
| 5,334,332 A | 8/1994 | Lee |
| 5,753,601 A | 5/1998 | Ward et al. |
| 5,795,702 A | 8/1998 | Tanabe et al. |
| 5,798,323 A | * 8/1998 | Honda et al. ............... 510/176 |
| 5,988,186 A | 11/1999 | Ward et al. |
| 6,326,130 B1 | * 12/2001 | Schwartzkopf et al. ..... 430/329 |
| 6,498,132 B2 | * 12/2002 | Morinaga et al. ........... 510/175 |
| 6,585,825 B1 | * 7/2003 | Skee ............................. 134/3 |

FOREIGN PATENT DOCUMENTS

| EP | 0647884 A1 | 4/1995 |
| GB | 2342727 A | 8/1994 |
| JP | 09/096911 | 4/1997 |
| JP | 09/152721 | 6/1997 |

* cited by examiner

Primary Examiner—Gregory E. Webb
(74) Attorney, Agent, or Firm—Baker Botts LLP

(57) ABSTRACT

The present invention is a photoresist remover composition used in order to remove photoresist during the manufacturing process of semiconductor devices, such as large-scale integrated circuits and very large-scale integrated circuits. The present invention comprises 2~20 weight % of water-soluble hydroxylamine, 5~15 weight % of oxime compound containing 2 or 3 hydroxyl groups, and 30~55 weight % of alkyl amide. The photoresist remover composition according to the present invention can easily and quickly remove a photoresist layer that is cured by the processes of hard-bake, dry-etching, and ashing and a side-wall photoresist polymer that is produced from the lower metal film by the reaction of the photoresist with etching and ashing gases during these processes. Especially, the photoresist remover composition has a good property of removing the side-wall photoresist polymer produced from the layers of aluminum, aluminum alloy, and titanium nitride. In addition, during removing process of photoresist, the photoresist remover composition can minimize the corrosion of lower metal film, in particular, the new metallic layers which is adopted to a production line of 64 MDRAM or more-VLSL.

4 Claims, 3 Drawing Sheets

PHOTORESIST REMOVER COMPOSITION

CROSS REFERENCE TO RELATED APPLICATION

This application is based on application No. 2000-32225 filed with the Korean Industrial Property Office on Jun. 12, 2000, the content of which is incorporated hereinto by reference.

BACKGROUND OF THE INVENTION (a) Field of the Invention

The present invention relates to a photoresist remover composition used to remove photoresist during the manufacture of semiconductor devices such as large-scale integrated circuits (LSI), and very large-scale integrated circuits (VLSI).

(b) Description of the Related Art

Generally, a photoresist pattern forms on a conductive layer of a semiconductor device during the manufacturing process of semiconductor devices, and then a part of the conductive layer, which is not covered with the pattern, is etched by repetitive lithography processes using the pattern as a mask, to form a conductive layer pattern. The photoresist pattern used as the mask should be removed from the conductive layer by using a photoresist remover during a stripping process performed after the formation of the conductive layer pattern. However, the recent processes in manufacturing very large-scale integrated circuits have adopted a dry etching process to form a conductive layer pattern, thus removing a photoresist during the next stripping process becomes difficult.

The dry etching process, opposed to a wet etching process using acidic chemical solution, is performed through a gas-solid reaction between a plasma etching gas and a material layer such as a conductive layer. The dry etching process is easily controllable and produces a sharp pattern, and thus it is currently leading the trend in etching processes. However, during the dry etching process of the conductive layer, ions and radicals of the plasma etching gas have a chemical reaction with the photoresist layer at the surface of a photoresist, so that the photoresist layers rapidly cured. Accordingly, removing the photoresist becomes difficult. Especially, on the stripping process, cured side-wall photoresist polymer which is produced from a conductive layer such as aluminum, aluminum alloy, and titanium nitride during the dry etching process has difficulty in being removed by most kinds of photoresist remover.

As earlier photoresist removers of the conventional stripping process, a photoresist remover composition obtained by mixing an organic amine compound and various organic solvents has been suggested, in particular a photoresist remover composition containing monoethanolamine (MEA) as an essential organic amine component has been widely used.

For example, a two-component photoresist remover composition consisting of a) an organic amine compound such as monoethanolamine (MEA) and 2-(2-aminoethoxy)ethanol (AEE), and b) a polar solvent such as N,N-dimethylacetamide (DMAc), N,N-dimethylformamide (DMF), N-methylpyrrolidone (NMP), dimethylsulfoxide (DMSO), carbitol acetate, and methoxyacetoxypropane (disclosed in U.S. Pat. No. 4,617,251); a two-component photoresist remover composition consisting of a) an organic amine compound such as monoethanolamine (MEA), monopropanolamine, and methylamylethanol, and b) an amide solvent such as N-methylacetamide (MAc), N,N-dimethylacetamide (DMAc), N,N-dimethylformamide (DMF), N,N-diethylacetamide (DEAc), N,N-dipropylacetamide (DPAc), N,N-dimethylpropionamide, N,N-diethylbuthylamide, and N-methyl-N-ethylpropionamide (disclosed in U.S. Pat. No. 4,770,713); a two-component photoresist remover composition consisting of a) an organic amine compound such as monoethanolamine (MEA), and b) a non-protonic polar solvent such as 1,3-dimethyl-2-imidazolidinone (DMI), and 1,3-dimethyl-tetrahydropirimidinone (disclosed in German Patent Laid-Open Publication No. 3,828,513); a photoresist remover composition, in predetermined mixing ratio, consisting of a) an alkanol amine such as monoethanolamine (MEA), diethanolamine (DEA) and triethanolamine (TEA) and alkylene polyamine substituted by ethylene oxide of ethylenediamine, b) sulfolane or sulfone compound, and c) glycol monoalkyl such as diethylene glycolmonoethyl ether and diethylene glycolmonobutyl ether (disclosed in Japanese Patent Laid-Open Publication No. Sho 62-49355); a photoresist remover composition consisting of a) water-soluble amine such as monoethanolamine (MEA) and diethanolamine (DEA), and b) 1,3-dimethyl-2-imidazolidinone (disclosed in Japanese Patent Laid-Open Publication No. Sho 63-208043); a positive photoresist remover composition consisting of a) amines such as mono-ethanolamine (MEA), ethylenediamine and benzylamine, b) a polar solvent such as DMAc, NMP and DMSO, and c) a surfactant (disclosed in Japanese Patent Laid-Open Publication No. Sho 63-231343); a positive photoresist remover composition, in predetermined mixing ratio, consisting of a) nitrogen-containing organic hydroxyl compound such as monoethanolamine (MEA), b) one or more solvents selected from a group of diethayleneglycol monoehthylether, dietyleneglycol dialkylether, γ-butylolactone and 1,3-dimethyl-2-imidazolinone, and c) DMSO (disclosed in Japanese Patent Laid-Open Publication No. Sho 64-42653); a photoresist remover composition consisting of a) an organic amine compound such as monoethanolamine (MEA), b) a non-protonic polar solvent such as diethylene glycol-monoalkyl ether, DMAc, NMP and DMSO, and c) a phosphate ester type surfactant (disclosed in Japanese Patent Laid-Open Publication No. Heisei 4-124668); a photoresist remover composition consisting of a) 1,3-dimethyl-2-imidazblinone (DMI), b) dimethylsulfoxide (DMSO), and c) organic amine compound such as monoethanolamine (disclosed in Japanese Patent Laid-Open Publication No. Heisei 4-350660); and a photoresist remover composition consisting of a) monoethanolamine (MEA), b) DMSO, and c) catechol (disclosed in Japanese Patent Laid-Open Publication No. Heisei 5-281753) have been suggested, and these photoresist remover compositions have excellent characteristics in safety, working efficiency and photoresist removing performance.

However, in recent processes for manufacturing semiconductor devices, there are trends toward hard-baking processes at high temperatures where various layers, as well as silicon wafer, are treated at a high temperature. The photoresist remover compositions of the above examples do not have the sufficient ability to remove the photoresist hard-baked at high temperatures. Thus, a photoresist remover composition containing water has been suggested to remove the photoresist hard-baked at high temperatures. For example, a photoresist remover composition consisting of a) hydroxylamine, b) alkanolamine, and c) water (disclosed in Japanese Patent Laid-Open Publication No. Heisei 4-289866); a photoresist remover composition consisting of a) hydroxylamine, b) alkanolamine, c) water, and d) an anticorrosive (disclosed in Japanese Patent Laid-Open Publication No. Heisei 6-266119); a photoresist remover composition containing a) a polar solvent such as GBL, DMF, DMAC and NMP, b) amino alcohols such as 2-methylaminoethanol, and c) water (disclosed in Japanese Patent Laid-Open Publication No. Heisei 7-69618); a photoresist remover composition containing a) amino alcohols such as monoethanolamine (MEA), b) water, and c) butyldiglycol (disclosed in Japanese Patent Laid-Open Publication No. Heisei 8-123043); a photoresist remover composition containing a) alkanolamines and alkoxyalkanolamines, b) glycol monoalkyl ether, c) sugar alcohols, d) a quaternary ammonium hydroxide, and e) water (disclosed in Japanes Patent Laid-Open Publication No. Heisei 8-262746); a photoresist remover composition containing a) one or more alkanolamines selected from monoethanlolamine or AEE, b) hydroxylamine, c) diethyleneglycolmonoalkyl ether, d) sugars (sorbitol), and e) water (disclosed in Japanese Patent Laid-Open Publication No. 9-152721); and a photoresist remover composition consisting of a) hydroxyl amine, b) water, c) amines having an acid dissociation constant (pKa) of 7.5~13, d) a water-soluble organic solvent, and e) an anticorrosive (disclosed in Japanese Patent Laid-Open Publication No. Heisei 9-96911) have been suggested. However, the above photoresist remover compositions have been examined to find that they are insufficient to remove a side-wall photoresist polymer changed in quality due to exposure to a plasma gas during the dry-etching process, or ashing process, that is used to manufacture very large-scale integrated circuits (VLSI). Thus, it is necessary to develop a photoresist remover that can be used in the dry-etching process.

As mentioned above, it is difficult for a conventional photoresist to remove the photoresist having been on the dry-etching process. The surface of the photoresist layer is cured by the heat generated from the reaction due to a high radiation dose and high energy of ion beams. At the same time, additionally, a photoresist residue may be produced due to a phenomenon of photoresist popping. Generally, the wafer on the ashing process is heated at 200° C. or higher. At this time, the solvent remaining in the photoresist should be exhausted, which is not possible because a cured layer exists on the surface of the photoresist after the ashing process.

Thus, as the ashing process is performed, the internal pressure of the photoresist layer increases and the surface of the photoresist layer pops due to the solvent existing therein, which is called popping. The cured layer formed on the surface of photoresist scatters and it is difficult to remove the resultant residue from the cured layer. In addition, the photoresist changes to residues and particles and acts as a contaminant, thereby lowering yield in VLSI chip production. Particularly, in order to effectively remove the photoresist, performing the ashing process before the stripping process makes the photoresist change more excessive, thus increasing the failure ratio of semiconductor devices during the stripping process.

Various etching processes have been suggested in order to effectively remove the cured photoresist layer described above, and among them, a two-stage ashing process has been disclosed by Fujimura in a pre-announcement for the Japanese Applied Physics Association in Spring (page 1~13, and page 574, 1389). According to the two-stage ashing process, ashing is first performed by a general method, and then a second ashing process is performed. However, these processes are complicated and require very large-scale equipment, thereby lowering the efficiency of the process.

Finally, this problem can be solved in the stripping process using an aqueous photoresist remover composition. A photoresist remover composition consisting of a hydroxylamine, an alkanol amine, an anticorrosive and water has recently been suggested and is widely used, since it has a relatively good removal characteristic to the cured photoresist. However, this photoresist remover composition has an under-cut, which is produced from corrosion to a new metal layer adopted to a 64 Mega-DRAM or more DRAM-semiconductor production line. Thus, development of a new photoresist remover that can address the fault is required.

SUMMARY OF THE INVENTION

It is an object of the present invention to provide a photoresist remover composition, which can easily and quickly remove a side-wall photoresist polymer, the property of which is changed by a dry-etching and ashing processes. In particular, the photoresist remover composition can remove a side-wall photoresist polymer which is produced from a metallic by-product that is etched from a titanium nitride layer. The photoresist remover composition of the present invention can also minimize corrosion of lower metal film material.

In order to achieve these objects, the present invention provides a photoresist remover composition comprising:

a) 2~20 weight % of water-soluble hydroxylamine;

b) 5~15 weight % of oxime compound;

c) 10~45 weight % of water;

d) 4~15 weight % of phenol compound containing 2 or 3 hydroxyl groups; and e) 30~55 weight % of alkyl amide.

In the photoresist remover composition according to the present invention, the content of the hydroxylamine is preferably 2~20 weight %. (The content of hydroxylamine on the market is the state of 50% aqueous solution.) That is, in the case where the content of water-soluble hydroxylamine is less than 2 weight %, it is difficult to totally remove the side-wall photoresist polymer which is changed by the dry-etching and ashing processes. In addition, in the case where the content of water-soluble hydroxylamine is more than 20 weight %, corrosion to the lower metal film materials such as aluminum and aluminum alloy, becomes greater.

In the photoresist remover composition of the present invention, the oxime compound is selected from a group consisting of butanone oxime and propanone oxime, and the content of oxime compound is preferably 5~15 weight %. In the case where the content of oxime compound is less than 5 weight %, the solubility for a stripped side-wall photoresist polymer becomes lower. In the case where the content of oxime compound is more than 15 weight %, the solubility for a photoresist at low temperatures becomes lower due to its high boiling point property.

In the photoresist remover composition according to the present invention, water is preferably pure water filtrated by ion exchange resin, and deionized water having a specific resistance of 18 MΩ or more is more preferable.

The water content is preferably 10~45 weight %. In the case where the water content in the photoresist remover composition of the present invention is less than 10 weight %, the ability to remove the photoresist becomes lower since water cannot activate the hydroxylamine. In the case where the water content is more than 45 weight %, its corrosion to the lower metal film material becomes higher, as well as the ability to remove the photoresist becomes lower, as the contents of the components in the photoresist remover composition, other than water, becomes smaller. After an investigation, it has been confirmed that the optimal content of water is 10~45 weight %.

According to the photoresist remover composition of the present invention, wherein the phenol compound containing 2 or 3 hydroxyl groups is represented by the following Chemical Formula 1:

[Chemical Formula 1]

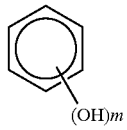

(OH)$_m$ wherein, m is an integer from 2 to 3.

According to the photoresist remover composition of the present invention, the phenol compound containing 2 or 3 hydroxyl groups have the function of making the hydroxyl ion, which is produced by the reaction of hydroxylamine with hydrogen ions of water, penetrate the contact surface between the conductive layers. In addition, the phenol compound containing 2 or 3 hydroxyl groups have an anticorrosive function in that it can keep the lower metal film material from being corroded by the hydroxyl groups produced from the photoresist remover composition.

The preferable content of the phenol compound containing 2 or 3 hydroxyl groups is 4~15 weight % In the case where the content of the phenol compound is less than 4 weight %, the corrosion of the lower metal film material becomes higher. In the case where the content of the phenol compound is more than 15 weight %, the viscosity of the photoresist composition rises, so there is inconvenience during its use.

According to the photoresist remover composition, the alkyl amide is represented by the following Chemical Formula 2:

[Chemical Formula 2]

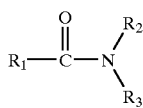

wherein, each of $R_1$, $R_2$, and $R_3$ is hydrogen or at least one or more alkyl groups, which are linear $C_1$~$C_2$ alkyl groups.

The content of the alkyl amide is preferably 30~55 weight %. In the case where the content of alkyl amide is less than 30 weight %, the solubility for a photoresist gets lower. In the case where the content of the alkyl amide is more than 55 weight %, the content of the other components gets smaller, so the photoresist resulting from the titanium nitride layer cannot be perfectly removed.

As a result of study, it has been found that a side-wall photoresist polymer can be removed by mixing oxime compounds and alkyl amide with the water-soluble hydroxylamine in the predetermined ratio.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which.

DETAILED DESCRIPTION OF THE PREFERRED EMBODIMENTS

Figure 1:
FIG. 1 is a scanning electron microscope (SEM) photo of cross section of a pattern which is dry-etched and ashed pattern, after coating a photoresist on a substrate which is laminated by aluminum alloy metallic layer (1), titanium nitride layer (2), tetraethyl orthosilicate (TEOS) (3), FOX (Flowable Oxide) (4), TEOS (5) in sequence, and forming via hole pattern.

In the following detailed description, only the preferred embodiment of the invention has been shown and described, simply by way of illustration of the best mode contemplated by the inventors of carrying out the invention. As will be realized, the invention is capable of modification in various obvious respects, all without departing from the invention. Accordingly, the drawings and description are to be regarded as illustrative in nature, and not restrictive.

On the other hand, the percentage and the mixing ratio in the following examples are based on a weight, without any mentioned. In the Examples and Comparative Examples of the present invention, the test for its efficiency was performed by the following methods.

(1) Test for Photoresist Removal Efficiency

Preparation for Specimen A

TEOS, FOX and TEOS was orderly vaporization-deposited with CVD machine on the surface of an 8 inch-silicon wafer which was orderly vaporization-deposited by aluminum alloy and titanium nitride layer on 800 Å and 150, Å respectively from the bottom. A film thickness of the generally used positive type photoresist composition (manufactured by Dong-jin Semichem Corp., DPR-i900) was 1.2 μm by spin-coating. Next, the above photoresist film was pre-baked in a hot plate for 90 seconds at 110° C. Predetermined via hole pattern mask was placed on the described photoresist film, and exposed to light. Then, the via hole pattern mask was developed by 2.38% tetramethylammonumhydroxide developer at 21° C. for 60 seconds, and then the specimen on which the above via hole pattern formed was hard-baked at 120° C. for 100 seconds. The photoresist pattern formed on the above specimen was used as a mask in a dry-etching machine (manufactured by Hitachi Corp., M318).

The exposed titanium nitride layer, which was not covered by photoresist pattern, was etched with a dry-etching gas that was a mixed gas of $SF_6$ and $Cl_2$ for 35 seconds. Sequentially, most of the photoresist was removed by an ashing machine with $O_2$ plasma, and then the specimen was prepared.

Photoresist Removal Test

The specimen A was respectively soaked in the photoresist remover composition at 65° C., for 5 minutes, 10 minutes, and 20 minutes. Sequentially, after the specimen A was removed from the photoresist remover composition, it was cleaned with deionized water, and dried by a nitrogen gas. It was checked whether or not photoresist residues stuck to the surrounding of the via hole pattern and to the surface of the line pattern, by using a scanning electron microscope (SEM), and the photoresist removal efficiency was evaluated. The results are tabulated in Table 2.

○: the case where the photoresist residue was completely removed from the surrounding of the via hole pattern and the surface of the line pattern;

Δ: the case where 80% or more of the photoresist residue was removed from the surrounding of the via hole pattern and the surface of the line pattern but a trace amount thereof remained; and X: the case where most of the photoresist residue remained on the surrounding of the via hole pattern and the surface of the line pattern.

(2) Test for Corrosion of Metal Pattern
Preparation for Specimen B

A specimen B was prepared on the same way to the preparation for the above specimen A.

Test for Corrosion of Metal Pattern

The specimen B was respectively soaked in the photoresist remover composition at 65° C. for 5 minutes, 10 minutes, and 20 minutes. Sequentially, after the specimen B was removed from the remover composition, it was cleaned with deionized water, and dried by nitrogen gas. It was checked whether or not an under-cut phenomenon took place on the lower metal film material, by using a scanning electron microscope (SEM), and the corrosion test was evaluated. The results are tabulated in the following Table 3.

○: the case where the lower metal pattern was not under-cut;

Δ: the case where the lower metal pattern was partly under-cut; and

X: the case where the lower metal pattern was mostly under-cut.

EXAMPLES 1~5 AND COMPARATIVE EXAMPLES 1~3

The contents of composition (a)~(e) was mixed in the described ratio of Table 1, and photoresist remover compositions of Examples 1~5 and Comparative Examples were respectively prepared. Then, (1) test for photoresist remover and (2) test for corrosion of the metallic layer pattern was performed on these photoresist remover compositions, and the results of the tests were respectively shown in Table 2 and Table 3.

TABLE 1

A Composition to Photoresist Remover Compositions

Composition of photoresist remover compositions (weight %)

| | Water-soluble amine | | oximes | | water | Phenol compounds | | Alkyl amides | | Amine solvents | |
|---|---|---|---|---|---|---|---|---|---|---|---|
| | kind | wt % | kind | wt % | wt % | kind | wt % | kind | wt % | kind | wt % |
| Example | | | | | | | | | | | |
| 1 | HDA | 2 | B-Oxime | 15 | 24 | PG | 8 | DMAc | 51 | | |
| 2 | HDA | 5 | P-Oxime | 15 | 25 | PC | 8 | DMAc | 47 | | |
| 3 | HDA | 10 | B-Oxime | 10 | 38 | PC | 5 | DMAc | 37 | | |
| 4 | HDA | 10 | B-Oxime | 10 | 30 | PC | 4 | N-MAc | 46 | | |
| 5 | HDA | 6 | P-Oxime | 5 | 31 | PG | 5 | N-MAc | 53 | | |
| Comparative Example | | | | | | | | | | | |
| 1 | HDA | 20 | — | — | 20 | PC | 5 | — | — | AEE | 55 |
| 2 | HDA | 19 | | | 19 | GA | 2 | | | AEE | 60 |
| 3 | HDA | 20 | — | — | 20 | GA | 5 | — | — | MEA | 55 |

HDA: Hydroxylamine
B-Oxime: Butanonoxime
P-Oxime: Propanonoxime
PG: Pyrogallol
PC: Pyrocatechol
GA: Gallic acid
DMAc: N,N'-Dimethylacetamide
N-MAc: N-Methylacetamide
MEA: Monoethanolamine
AEE: 2-(2-Aminoethoxy)ethanol

TABLE 2

Photoresist Removal Efficiency for Photoresist Remover Compositions

| | Soaking Time | | |
|---|---|---|---|
| | 5 minutes | 10 minutes | 15 minutes |
| Example | | | |
| 1 | Δ | ○ | ○ |
| 2 | ○ | ○ | ○ |
| 3 | ○ | ○ | ○ |
| 4 | ○ | ○ | ○ |
| 5 | ○ | ○ | ○ |
| Comparative Example | | | |
| 1 | X | Δ | Δ |
| 2 | X | X | X |
| 3 | X | X | Δ |

Figure 2:
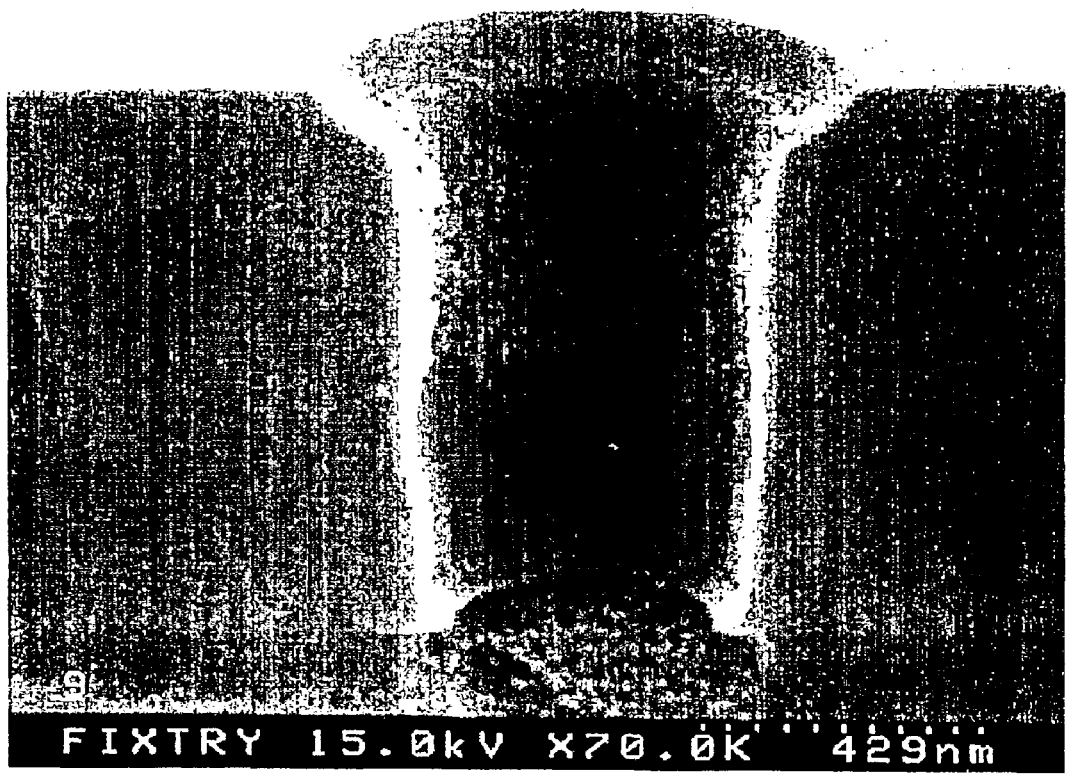
FIG. 2 is a scanning electron microscope (SEM) photo showing the result of test for removing a photoresist at 65° C. with a photoresist remover composition in the Comparative Example 1 after performing the ashing process of the pattern of FIG. 1 and removing a part of a photoresist.
Figure 3:
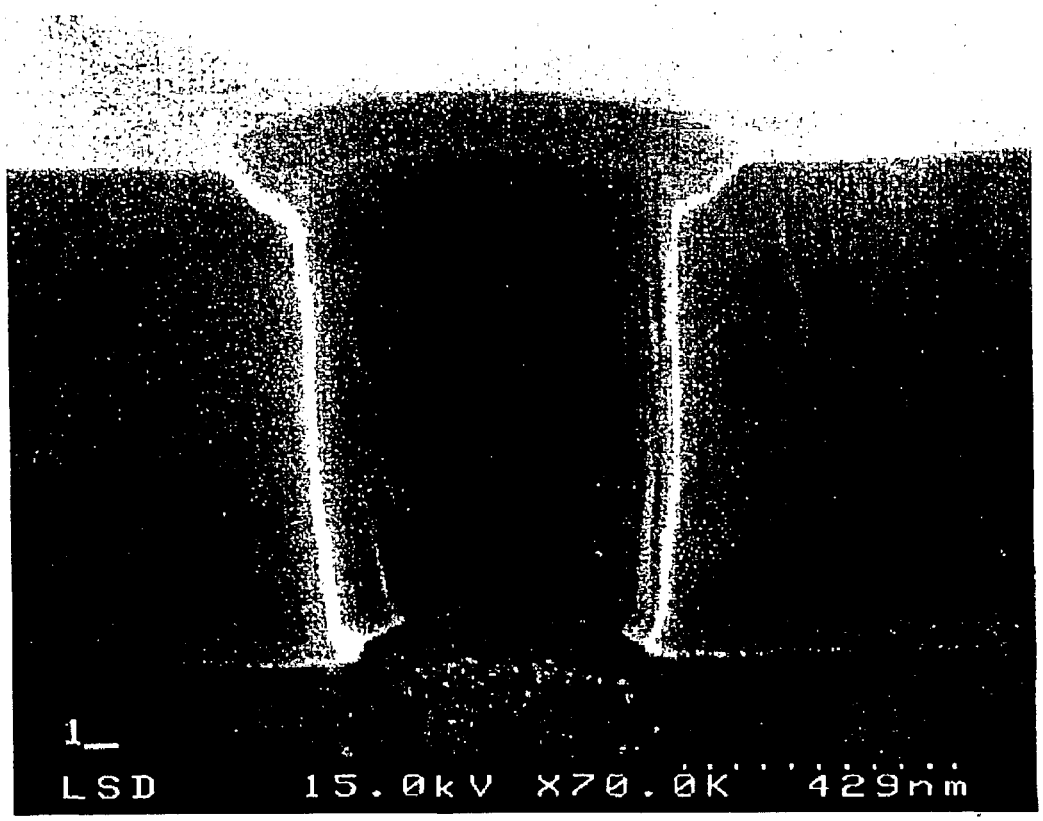
FIG. 3 is a scanning electron microscope (SEM) photo showing the photoresist removal efficiency at 65° C. with a photoresist remover composition in the Example 3, after performing the ashing process of the pattern of FIG. 1 and removing a part of a photoresist.

FIG. 1~FIG. 3 are photos of scanning electron microscope (SEM, manufactured by Hitachi, No. S-4100), comparing photoresist removal efficiency for the photoresist remover composition of Example 3 with that of Comparative Example 1.

FIG. 1~FIG. 3 shows the test results of test for specimen A under the condition where the photoresist remover composition was at 65 C.

FIG. 1 is a photo of cross section of a conductive layer pattern which is performed by dry-etching and ashing processes after orderly laminated by aluminium alloy layer (1), titanium nitride layer (2), tetraethyl orthosilicate (TEOS) (3), FOX (Flowable Oxide) (4), tetraethyl orthosilicate (TEOS) (4), and tetraethyl orthosilicate (TEOS) (5), and then photoresist (6) is coated on the laminated layer. Sidewall photoresist polymer is shown to exist on the whole cross section of the via hole by FIG. 1.

FIG. 2 is a photo of scanning electron microscope (SEM) showing the result of test for photoresist remove composition removal efficiency for the photoresist in the Comparative Example 1, at 65° C.

FIG. 3 is the photo of scanning electron microscope (SEM) showing the result of test for photoresist remove composition removal efficiency for the photoresist in the Example 3, at 65° C.

TABLE 3

Test for Anticorrosion of Metallic Wires

| | Soaking time | | |
|---|---|---|---|
| | 5 minutes | 10 minutes | 15 minutes |
| Example | | | |
| 1 | ○ | ○ | ○ |
| 2 | ○ | ○ | ○ |
| 3 | ○ | ○ | Δ |
| 4 | ○ | ○ | ○ |
| 5 | ○ | ○ | ○ |
| Comparative Example | | | |
| 1 | Δ | Δ | X |
| 2 | ○ | Δ | Δ |
| 3 | ○ | Δ | X |

As described above, the photoresist remover composition according to the present invention can easily and quickly remove a photoresist layer that is cured by the processes of dry-etching, ashing and ion-implantation, and a photoresist layer, the property of which is changed by a metallic by-product etched from the lower metal film material during these processes. In addition, during the stripping process of a photoresist, the photoresist remover composition can minimize the lower metallic wire, particularly copper wire, and during a subsequent rinsing process, the layer can be rinsed by only water without organic solvents such as isopropyl alcohol and dimethylsulfoxide.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A photoresist remover composition comprising:
   a) 2~20 weight % of water-soluble hydroxyl amine;
   b) 5~15 weight % of oxime compound;
   c) 10~45 weight % of water;
   d) 4~15 weight % of organic phenol compound containing 2 or 3 hydroxyl groups; and
   e) 30~55 weight % of alkyl amide.

2. The photoresist remover composition according to claim 1,
   wherein the oxime compound of b) is selected from a group consisting of butanonoxime, propanonoxime and a mixture thereof.

3. The photoresist remover composition according to claim 1,
   wherein the alkyl amide of e) is represented by the following Chemical Formula 2:

[Chemical Formula 2]

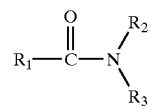

wherein, each of $R_1$, $R_2$, and $R_3$ is hydrogen or at least one or more alkyl groups, which are linear $C_1$~$C_2$ alkyl.

4. The photoresist remover composition according to claim 1,
   wherein the organic phenol compound of d) is represented by the following Chemical Formula 1:

[Chemical Formula 1]

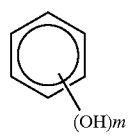

wherein, m is an integer from 2 to 3.

* * * * *